United States Patent [19]

Sugai et al.

[11] 4,246,441
[45] Jan. 20, 1981

[54] FM RECEIVER EQUIPPED WITH NOISE PULSE SUPRESSION DEVICE

[75] Inventors: Yoshiro Sugai; Eizi Ueno, both of Kawagoe, Japan

[73] Assignee: Pioneer Electronic Corporation, Tokyo, Japan

[21] Appl. No.: 20,685

[22] Filed: Mar. 15, 1979

[30] Foreign Application Priority Data

Mar. 15, 1978 [JP] Japan .................................. 53/30325

[51] Int. Cl.³ .............................................. H04H 5/00
[52] U.S. Cl. ...................................... 179/1 GD; 455/223
[58] Field of Search .......... 179/1 GD, 1 GE; 325/36, 325/402, 403, 473, 478, 481; 455/218, 222, 223, 283, 287, 296

[56] References Cited

U.S. PATENT DOCUMENTS

| 3,739,285 | 6/1973 | Hepp | 179/1 GD |
| 4,066,845 | 1/1978 | Kishi | 325/478 |
| 4,195,203 | 3/1980 | Sakai et al. | 179/1 GD |

FOREIGN PATENT DOCUMENTS 2807600 8/1978 Fed. Rep. of Germany ....... 179/1 GD

*Primary Examiner*—Douglas W. Olms
*Attorney, Agent, or Firm*—Sughrue, Rothwell, Mion, Zinn and Macpeak

[57] ABSTRACT

An FM receiver including a noise pulse detection circuit which receives an FM detected signal containing a pilot signal and produces a control signal when a noise pulse is detected. A gate is operable to interrupt the transmission of the FM detected signal to the subsequent stage for the duration of the presence of the noise pulse responsive to the control signal and a holding circuit holds the FM detected signal of the level immediately before the interrupting operation of the gate. A multiplex demodulator receives outputs of the gate and the holding circuit for demodulating an applied FM detected signal. A signal generator is provided in the multiplex demodulator for generating a signal whose frequency and phase are same as those of the pilot signal. A superimposing circuit superimposes a signal obtained from the signal generator on the output of the holding circuit for the duration of the presence of the noise pulse.

5 Claims, 5 Drawing Figures

19 KHz PILOT SIGNAL $t_1$ $t_2$

FM RECEIVER EQUIPPED WITH NOISE PULSE SUPRESSION DEVICE

BACKGROUND OF THE INVENTION

This invention relates to an FM receiver and more particularly to an FM stereophonic receiver equipped with a noise pulse suppression device.

Noise due to automobile electric motor wipers, particularly noise pulses emanating from automobile ignitions cause trouble in an FM receiver. Such noise pulse is capable of suppression to a limited extent by a limiter circuit after intermediate frequency amplification. However, in practice, the noise pulse is not sufficiently reduced or eliminated by such a limiter circuit. Heretofore, in order to more sufficiently remove the noise pulses, a noise suppression circuit 10 as shown in FIG. 1 has been employed.

Referring to FIG. 1, an FM detected composite signal containing a 19 KHz pilot signal, which is the output of an FM detection circuit 1, is delivered to both a delay circuit 2 and a noise pulse detection circuit 3 comprising a high-pass filter. The afore-mentioned noise pulse is detected out from the composite signal by means of the high-pass filter and then the composite signal is delivered to a shaping circuit 4 in the timed relationship with the occurrence of the noise pulse. The shaping circuit 4 constitutes a monostable multivibrator, which produces control pulses for a predetermined duration. On the other hand, the composite signal passing through the delay circuit 2 is applied to a gate circuit 5 whose gating operation is controlled in response to the output pulses of the multivibrator (4).

The gate circuit 5 operates to prevent the composite signal from being delivered to the next stage during the presence of the output pulses of the multivibrator (4). For the time period when the output pulse of the multivibrator (4) is applied to the gate circuit 5, the output of a level hold circuit 6 is delivered to the next stage. Hence, the level hold circuit 6 functions to hold the composite signal at the level immediately before the cut-off operation of the gate circuit 5. The outputs of the gate circuit 5 and the level hold circuit 6 are delivered to a multiplex (MPX) demodulator circuit 8 where the composite signal is separated into signals for right and left channels.

FIGS. 2(a) through 2(c) are waveform diagrams for operational description of the circuit shown in FIG. 1. FIG. 2(a) is the FM detected composite signal containing the 19 KHz pilot signal. Assuming now that a noise pulse (not shown) is superimposed on the composite signal at a time interval T between $t_1$ and $t_2$, the multivibrator (4) operates in response to the output of highpass filter (3) to produce inhibit pulses for the duration of T. The gate circuit 5 is then put in a cut-off condition for the duration of T, and therefore the FM detected composite signal is not delivered to the next stage. In this situation, the level hold circuit 6 holds the level of the composite signal at the time $t_1$ and the same is transmitted to the MPX demodulator circuit 8. The signal as shown in FIG. 2(b) is applied to the MPX demodulator circuit 8. The signal shown in FIG. 2(b) is demodulated into a waveform as shown in FIG. 2(c) after low-pass filtering in the demodulator circuit 8.

As can be appreciated, although the noise pulse introduced at the time interval T is removed, unwanted noise still remains as a part of the audio signal. Particularly, in the case where the audio signal is minute relative to the 19 KHz pilot signal, unwanted noise proportional to the level of the pilot signal becomes notable as can be seen from FIG. 2(c).

SUMMARY OF THE INVENTION

Accordingly, an object of the present invention is to provide an FM receiver with a noise pulse suppression device capable of completely eliminating the aforementioned unwanted noises.

Briefly, and in accordance with the present invention, when the gate circuit 5 of FIG. 1 is in the cut-off condition so as not to transmit the composite signal to the MPX demodulator circuit 8, a signal with the same frequency and the same phase as the 19 KHz pilot signal is superimposed on the output of the level hold circuit 6. Hence the unwanted noise component caused by the pilot signal is suppressed. A signal locked with the pilot signal derived from a phase locked loop in the MPX demodulator circuit 8 is employed for the signal to be superimposed thereon.

DETAILED DESCRIPTION OF THE PREFERRED EMBODIMENT

One embodiment according to the present invention will now be described with reference to FIGS. 3 through 6.

Figure 1:
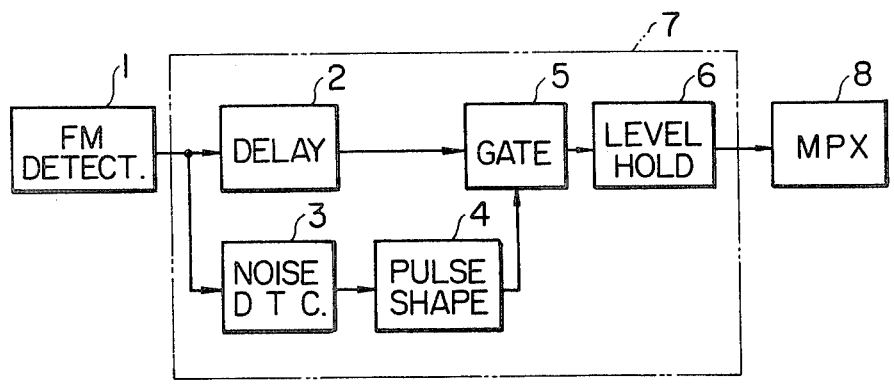
FIG. 1 is a block diagram showing a conventional noise suppression device.
Figure 2A:
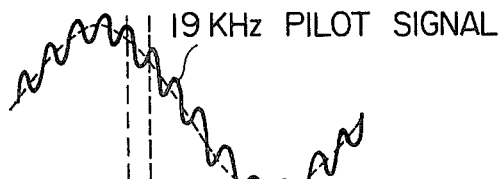
FIGS. 2(a) through 2(c) are waveform diagrams for description of the device shown in FIG. 1.
Figure 2B:
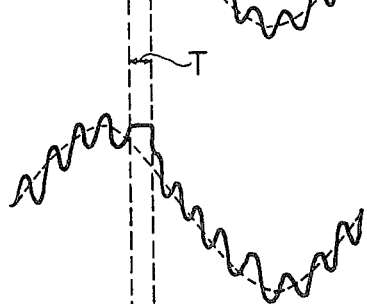
Figure 2C:
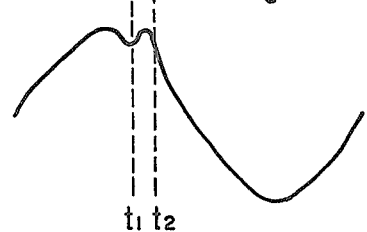
Figure 3:
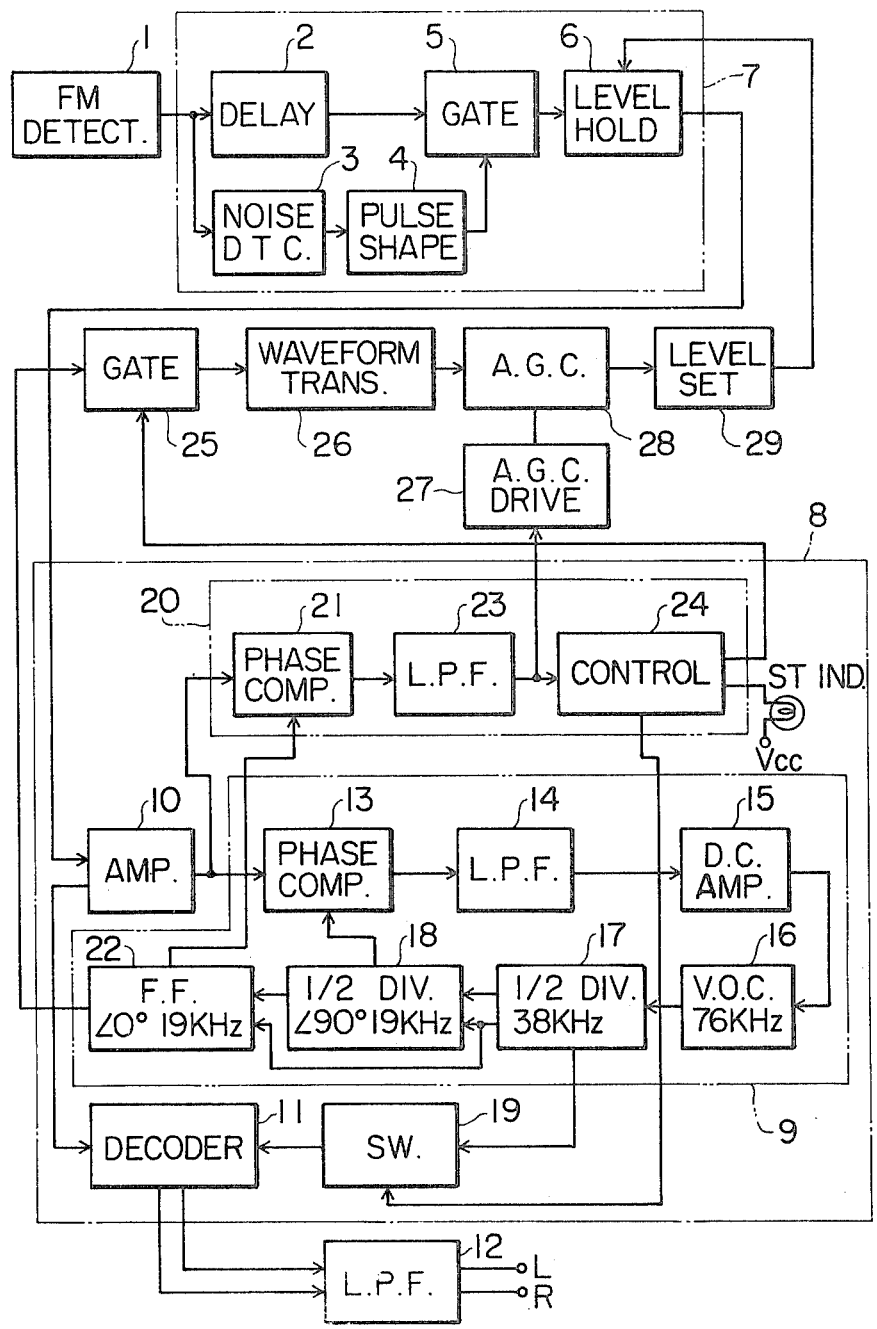
FIG. 3 is a block diagram showing one embodiment according to the present invention.

FIG. 3 is a block diagram illustrating one preferred embodiment of the present invention, in which like numerals refer to like sections shown in FIG. 1. The MPX demodulator circuit 8 is a conventionally known circuit construction employing a phase locked loop (PLL) 9 to obtain a 38 KHz subcarrier signal locked with the 19 KHz pilot signal. Specifically, a composite signal received from the noise suppression circuit 7 is augmented by means of an amplifier 10 and then applied to a decoder 11. The pilot signal is applied to one input of a phase comparator 13. A voltage controlled oscillator (VC0) 16 provides at its output a 76 KHz signal which is then subjected to frequency division into 38 KHz by means of a frequency divider 17. The output of the frequency divider 17 is further subjected to frequency division into 19 KHz by means of a second frequency divider 18. The output of the frequency divider 18 is applied to the other input of the phase comparator 13.

The output of the phase comparator 13 is applied through a low-pass filter 14 to a d.c. amplifier 15, and thereafter to VCO 16 for control to the phase of oscillation frequency of the VCO 16. The 38 KHz sub-carrier frequency from the frequency divider 17 is applied through a switching circuit 19 to the decoder 11. The output of the decoder 11 passes through a low-pass filter 12, from which signals for left and right channels are derived.

The switching circuit 19 is employed to prevent the sub-carrier from being transmitted to the decoder 11 when a monophonic signal is received. For achieving this result, a discrimination circuit 20 is provided to discriminate the presence of the pilot signal from the composite signal. More specifically, the pilot signal output derived from the amplifier 10 is applied to one input of a phase comparator 21 and a 19 KHz output of the frequency divider 18 is applied to the other input thereof through a flip-flop 22 so that the output of the flip-flop 22 is the same phase as that of the pilot signal. The output of the comparator 21 is delivered through a low-pass filter 23 to a control signal generating section 24 and the output controls a stereo indicator (ST IND) and the aforementioned switching circuit 19.

In the present invention, the 19 KHz signal (which corresponds in FIG. 3 to the output of the flip-flop 22) is superimposed on the output signal of the level hold circuit 6 only for the interval T. The 19 KHz signal is completely locked with the pilot signal obtained through the PLL circuit 9 in the demodulator circuit 8. To implement this signal processing, there are provided a waveform transformation circuit 26, an automatic gain control (AGC) drive circuit 27, an AGC circuit 28 and a level setting circuit 29. The 19 KHz output signal of the flip-flop 22 in the PLL circuit 9 is applied through a gate circuit 25 to the input of the waveform transformation circuit 26. The gating operation of the gate circuit 25 is controlled by the control signal obtained from the pilot signal discrimination circuit 20. In the case of receiving a monophonic broadcasting program, the gate circuit 25 operates to cut-off the 19 KHz signal and to prevent a free-running frequency (19 KHz) signal produced in the PLL circuit from being superimposed on the output signal of the hold circuit 6. This prevents misoperation in the case of monophonic operation.

The waveform transformation circuit 26 is employed to transform the rectangular waveform signal obtained through the PLL circuit 9 into a sine waveform signal. The sine waveform signal is then applied to the AGC circuit 28 which operates in correspondence with the level of the pilot signal to supply the 19 KHz signal with the same level as that of the pilot signal to the MPX demodulator circuit 8 when the gate circuit 5 is in the cut-off condition.

Figure 4:
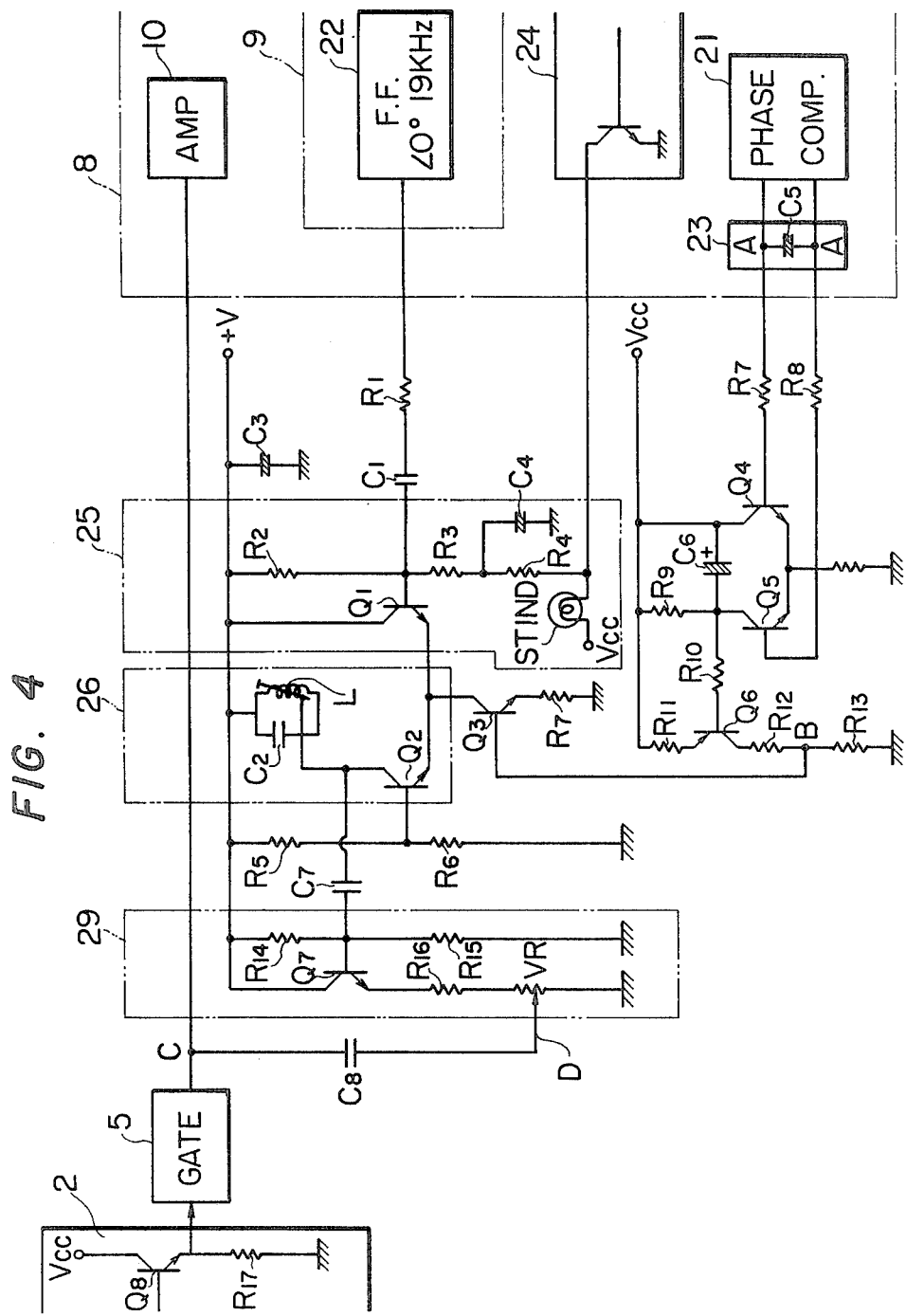
FIG. 4 is a circuit diagram showing an example of essential sections shown in FIG. 3.

FIG. 4 is a circuit diagram showing the essential parts of the present invention shown in FIG. 3.

The 19 KHz signal obtained through the PLL circuit 9 is applied to the base of a transistor $Q_1$ included in the gate circuit 25 via a series-connected resistor $R_1$ and capacitor $C_1$. The base of the transistor $Q_1$ is coupled to a positive power source +V through a resistor $R_2$ and receives the control signal through resistors $R_3$ and $R_4$.

The waveform transformation circuit 26 includes a transistor $Q_2$ having at its collector a parallel-connected capacitor $C_2$ and coil L for tuning the 19 KHz signal. The emitters of transistors $Q_1$ and $Q_2$ are commonly connected, thereby constituting a differential amplifier. A reference voltage is applied to the base of the transistor $Q_2$ using resistors $R_5$ and $R_6$. The commonly connected emitters of the transistors $Q_1$ and $Q_2$ are grounded via the collector emitter path of a transistor $Q_3$ and a resistor $R_7$.

Accordingly, if the level of the control signal is set to be high at the time of monophonic broadcasting whereas the level thereof is set to be low at the time of stereophonic broadcasting, the transistor $Q_1$ reaches a saturated condition and the transistor $Q_2$ is in a non-conductive condition in the former case. Both the transistors $Q_1$ and $Q_2$ become normally conductive in the latter case. Thus, the purpose as a gate is attained by the transistor $Q_1$. The 19 KHz signal transformed into a sine waveform by the tuning elements is applied through a capacitor $C_7$ to the next stage.

The output of the phase comparator 21 passes through the low-pass filter 23 comprising a capacitor $C_5$ to thereby convert the output of the phase comparator 21 into a d.c. signal, and the level is varied in proportion to the level of the pilot signal. Resistors $R_7$ and $R_8$ are provided for buffering and do not affect the operations of the phase comparator 21 and the low pass-filter 23. When the pilot signal is applied to the phase comparator 21, the d.c. voltage is yielded between points A and A', which is then augmented by a differential amplifier comprising transistors $Q_4$ and $Q_5$. The output of the differential amplifier is applied to the base of a transistor $Q_6$ via a resistor $R_{10}$. As a result, the transistor $Q_6$ is rendered conductive and a current flows through resistors $R_{12}$ and $R_{13}$ coupled to the collector thereof.

The juncture point B between the resistors $R_{12}$ and $R_{13}$ is connected to the base of the transistor $Q_3$, thereby biasing the transistor $Q_3$ when the transistor $Q_6$ is conductive. The signal to be supplied to the MPX demodulator circuit 8 when the gate circuit 5 is in the cut-off condition is adjusted by a variable resistor VR so as to be same level as that of the pilot signal. Accordingly, regardless of the differential level in the pilot signal because of the broadcasting station signal, the 19 KHz signal with the same level as that of the pilot signal being received is supplied to the MPX demodulator circuit 8.

In the level transformation circuit 29, the applied input signal through the capacitor $C_7$ is subjected to an impedance transformation by an emitter-follower circuit comprising a transistor $Q_7$ and resistors $R_{14}$ and $R_{15}$, and is then applied to a level setting resistor VR via a resistor $R_{16}$. The level setting resistor VR is used as the series connected resistor to a capacitor $C_8$ included also in the level hold circuit 6. The transistor $Q_8$ operates as a constant current source of the differential amplifier comprising the transistors $Q_1$ and $Q_2$. Since in the differential amplifier the gain thereof varies depending on the collector currents flowing in the respective transistors, the gain of the waveform transformation circuit 26 can be controlled by controlling the base bias of the transistor $Q_4$. This is the AGC operation, which is implemented in accordance with the level variation of the pilot signal being received. Accordingly, the 19 KHz signal to be supplied to the MPX demodulator circuit 8 when the gate circuit 5 is in cut-off condition is automatically controlled so that the level thereof is in coincidence with that of the pilot signal being received.

In the circuit construction as described, the output part of the delay circuit 2 which is the preceeding stage of the gate circuit 5 is an emitter-follower construction as shown in FIG. 4 comprising a transistor $Q_8$ and a resistor $R_{17}$. In normal operation where the gate circuit 5 transmits the composite signal, the impedance at point C, i.e. the output point of the gate circuit 5 is low in equivalent to the output impedance of the emitter-follower of the delay circuit 2, which may be in the order of 20 Ohms. Conversely, the impedance of the level setting circuit 29 as viewed from a point D, i.e. the juncture point of the capacitor $C_8$ and the variable resistor VR is relatively high in comparison with the impedance at the point A. This is because the former impedance is equivalent to the parallel resistance of the series-connected resistor $R_{16}$ and emitter-follower ($Q_7$) and the resistance of resistor VR, wherein the resistance of resistors VR and $R_{16}$ are in the order of several kilo Ohms. Accordingly, due to the impedance ratio, the output signal of the level setting circuit 29 is attenuated and does not appear on the point C. However, in the case where the gate circuit 5 carries out a cut-off operation, a signal appears on the point C such that the 19 KHz signal is superimposed on the output signal of the level hold circuit 6.

As described, only during the cut-off interval T the 19 KHz signal is superimposed on the composite signal. Hence, the object of the present invention is achieved.

Figure 5:
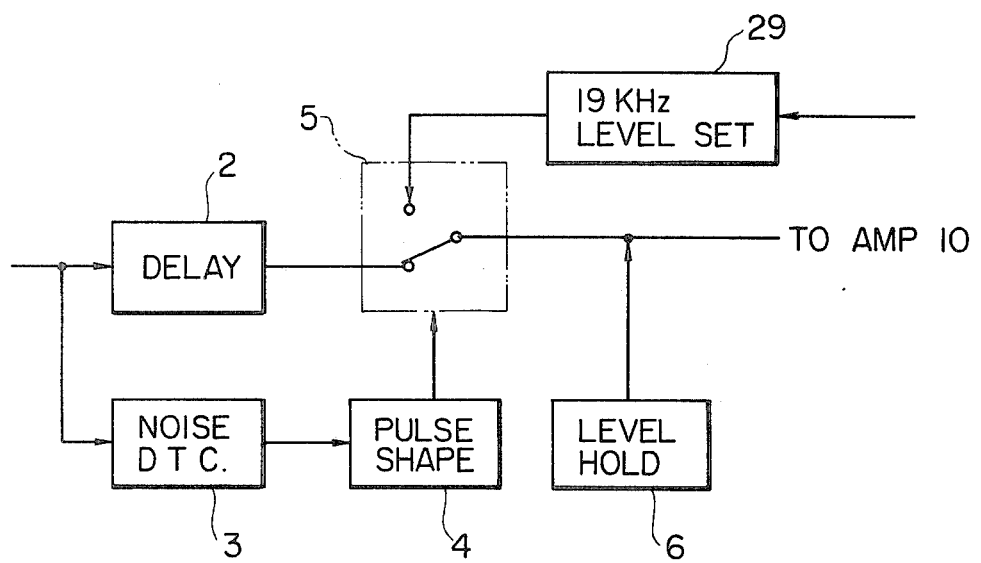
FIG. 5 is a block diagram showing another embodiment according to the present invention.

FIG. 5 is a block diagram showing another embodiment of the present invention. The output of a 19 KHz level setting circuit 29 is applied to the gate circuit 5 which operates to selectively switch the composite FM detected signal obtained from the output of the delay circuit 2 and the 19 KHz signal obtained from the level setting circuit 29 and then transmit it to the next state. Therefore, by controlling the gating operation of the gate circuit 5 in response to the output signal of the pulse shaping circuit 4, the 19 KHz signal is superimposed on the output of the level hold circuit 6 only during the time interval T.

As is described in detail, according to the present invention, during the production of unwanted noise pulse emanating from, for example, automobile ignitions, the transmission of the composite signal is interrupted by the gate circuit 5 and the signal with the same phase and the same frequency as those of the pilot signal is superimposed on the composite signal of the level immediately before the transmission of the composite signal is interrupted. Accordingly, the present invention is advantageous in that so-called switching noise as produced in the conventional circuit is suppressed and the circuit construction is simplified because the signal to be superimposed thereon is derived from the multiplex demodulator circuit.

In the case where the time interval (T) is approximately 30 to 50 micro seconds during which the gate circuit 5 carries out the cut-off operation due to the pulse noise, the time for releasing the lock of PLL circuit due to the intermission of the pilot signal is determined by the time constant of the low-pass filter 14 and which is generally in the order of several micro seconds. Therefore, no inconvenience is caused in the operation of the demodulator circuit by the intermission of the pilot signal due to the cut-off operation of the gate circuit 5.

While the invention has been explained with respect to the preferred embodiments, it is apparent that modifications can be made without departing from the scope thereof.

What is claimed is:

1. In an FM receiver including noise pulse detection means receiving an FM detected signal containing a pilot signal and producing a control signal when a noise pulse is detected, a gate means operable to interrupt the transmission of the FM detected signal to an output thereof for the duration of the presence of the noise pulse and responsive to the control signal, holding means for holding the FM detected signal of the level immediately before the interrupting operation by said gate means, and multiplex demodulator means receiving outputs of said gate means and said holding means for demodulating an applied FM detected signal, the improvement comprising; signal generating means provided in said multiplex demodulator means for generating a signal whose frequency and phase are same as the pilot signal and, superimposing means for superimposing a signal obtained from said signal generating means onto the output of said holding means for the duration of the presence of the noise pulse; said signal generating means including a voltage controlled oscillator, means for frequency dividing an output of said voltage controlled oscillator into a predetermined frequency, a phase comparator for comparing an output of said frequency divider means with a phase of the pilot signal and a phase locked loop for controlling said voltage controlled oscillator responsive to an output of said phase comparator and wherein a signal derived from said phase locked loop is superimposed on the output of said holding means.

2. The FM receiver as defined in claim 1 wherein said superimposing means operates to set the signal of said signal generating means to a predetermined level and supply to said gate means and wherein said gate means operates to selectively switch the FM detected signal and an output of said superimposing means to permit either of them to be transmitted to said multiplex demodulator means.

3. In an FM receiver including a noise pulse detection means receiving an FM detected signal containing a pilot signal and produces a control signal when a noise pulse is detected, a first gate means operable to interrupt the transmission of the FM detected signal to an output thereof for the duration of the presence of the noise pulse and responsive to the control signal, holding means for holding the FM detected signal of the level immediately before the interrupting operation by said first gate means, and multiplex demodulator receiving outputs of said first gate means and said holding means for demodulating an applied FM detected signal, the improvement comprising signal generating means provided in said multiplex demodulator means for generating a signal whose frequency and phase are same as the pilot signal, pilot signal detection means provided in said multiplex demodulator means for detecting the presence of the pilot signal from an applied signal to said multiplex demodulator means and producing a detection signal, second gate means for controlling the transmission of the signal obtained from said signal generating means responsive to the detection signal produced by said pilot signal detection means and superimposing means for superimposing a signal transmitted from said signal generating means onto the output of said holding means for the duration of the presence of the noise pulse.

4. The FM receiver as defined in claim 3 wherein said signal generating means includes a voltage controlled oscillator, means for frequency dividing an output of said voltage controlled oscillator into a predetermined frequency, a phase comparator for comparing an output of said frequency divider means with a phase of the pilot signal and a phase locked loop for controlling said voltage controlled oscillator responsive to an output of said phase comparator and wherein a signal derived from said phase comparator and wherein a signal derived from said phase locked loop is superimposed on the output of said holding means.

5. The FM receiver as defined in claim 3 or 4 wherein said superimposing means operates to set the signal of said signal generating means to a predetermined level and supply to said first gate means and wherein said first gate means operates to selectively switch the FM detected signal and an output of said superimposing means to permit either of them to be transmitted to said multiplex demodulator means.

* * * * *